United States Patent [19]

Mayer

[11] 4,062,290

[45] Dec. 13, 1977

[54] ELECTRICAL FUZE FOR PROJECTILES

[75] Inventor: Cornelius Mayer, Fallanden, Switzerland

[73] Assignee: Werkzeugmaschinenfabrik Oerlikon-Buhrle AG, Zurich, Switzerland

[21] Appl. No.: 750,260

[22] Filed: Dec. 13, 1976

[30] Foreign Application Priority Data

Jan. 23, 1976 Switzerland ............... 811/76

[51] Int. Cl.² .................................. F42C 11/00
[52] U.S. Cl. ................................... 102/70.2 R
[58] Field of Search ............ 102/70.2 R; 174/68.5; 317/101 B, 101 C

[56] References Cited

U.S. PATENT DOCUMENTS

| 2,395,782 | 2/1946 | Good | 102/70.2 R |
| 2,458,464 | 1/1949 | Busacker et al. | 102/70.2 R |
| 2,458,470 | 1/1949 | Hafstad et al. | 102/70.2 R |
| 2,712,791 | 7/1955 | Bleakney et al. | 102/70.2 R |
| 2,737,890 | 3/1956 | Brode | 102/70.2 R |
| 2,897,760 | 8/1959 | Mott-Smith | 102/70.2 R |

Primary Examiner—Charles T. Jordan
Attorney, Agent, or Firm—Werner W. Kleeman

[57] ABSTRACT

An electrical fuze for projectiles, especially rockets, comprising a short-circuit connection for bridging a firing chain of a detonator cap and a device for interrupting the short-circuit connection. The short-circuit connection is formed by part of a conductor track provided at a printed circuit board and which adheres to a layer or portion of the printed circuit board forming a fracture or breaking location.

4 Claims, 4 Drawing Figures

ELECTRICAL FUZE FOR PROJECTILES

The present invention relates to a new and improved construction of an electrical fuze for projectiles, especially rockets, comprising a short-circuit connection for bridging a firing or ignition chain of a detonator cap and a device for interrupting the short-circuit connection.

In a heretofore known fuze of this type, the short-circuit connection is formed by a thin wire which is fastened by soldering to both sides and above the opening of a bore provided in a firing or ignition body. Upon firing the projectile containing the fuze the wire is ruptured by a bolt movable in the bore and thus there is eliminated the short-circuit.

Such short-circuit connections require extremely careful manufacturing operations, especially at the soldering points, where however there is present the danger of corrosion, especially if the device containing such short-circuit connection is stored over a longer period of time as is oftentimes the case for military equipment. Since the amount of energy needed to rupture the wire is not prone to too great fluctuations, all of the wires should be equally tensioned. Furthermore, when using wires there is generally present the danger of premature rupture during mounting of the fuze.

SUMMARY OF THE INVENTION

It is therefore a general object of the present invention to provide an improved electrical fuze for projectiles which is not associated with the aforementioned drawbacks and limitations of the prior art constructions.

Another and more specific object of the present invention aims at an improved construction of an electrical fuze for projectiles having a short-circuit connection which is relatively easily and inexpensively formed, can be broken extremely reliably, and allows the equipment containing the fuze having the short-circuit connection to be stored over longer periods of time without fear of fuze malfunction due to corrosion effects.

Now in order to implement these and still further objects of the invention, which will become more readily apparent as the description proceeds, the invention contemplates forming the short-circuit connection as part of a conductor track of a printed circuit board, and which conductor track-part adheres to a layer of the printed circuit board forming a fracture location.

BRIEF DESCRIPTION OF THE DRAWINGS

The invention will be better understood and objects other than those set forth above, will become apparent when consideration is given to the following detailed description thereof. Such description makes reference to the annexed drawings wherein.

DETAILED DESCRIPTION OF THE PREFERRED EMBODIMENTS

Figure 1:
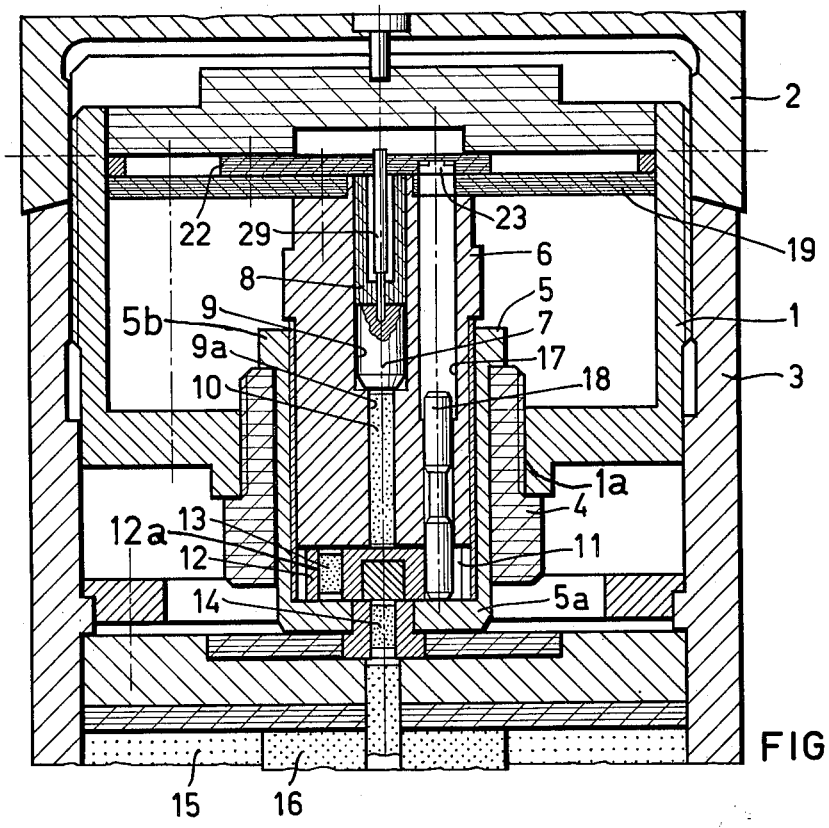
FIG. 1 is a fragmentary longitudinal sectional view of a fuze designed according to the present invention.

Describing now the drawings, it is to be understood that only enough of the structure of the projectile with which the fuze of this invention is employed has been shown in the drawings to enable those skilled in the art to readily understand the underlying principles of the invention. Turning attention therefore to FIG. 1, there will be recognized a bushing 1 which forms a connection between the rear housing 2 of a rocket engine and the front projectile body 3 of a hollow explosive charge projectile. A sleeve 4 formed of insulating material is threaded into a central bore 1a of the bushing 1. A sleeve 5 bears by means of a flange 5b forwardly against the sleeve 4. A substantially cylindrical firing or ignition body 6 is inserted into the sleeve 5. A detonator cap 7 and an insulating body 8 are arranged in a central bore 9 of the firing or ignition body 6. The narrower portion 9a of bore 9 contains molded parts 10 formed of explosive material. The bore 9a opens into a groove or recess 11 extending transversely with respect to the lengthwise axis of the rocket, this groove 11 being formed at the front side of the firing or ignition body 6. A slide 12 is arranged in the groove 11 and contains within a bore 12a a primer or propagation charge 13 formed of explosive material.

In the position of the slide 12 shown in FIG. 1, the axis of the primer charge 13 does not coincide with the lengthwise axis of the rocket. Further parts of the firing or ignition chain of the fuze are constituted by a primer or propagation charge 14 threaded into the cover 5a of the sleeve 5 as well as a primer- and reinforcement charge 16 arranged in the explosive charge 15 of the projectile. A bore 17 which is parallel to the lengthwise axis of the rocket opens into the groove 11. A bolt 18 is displaceably mounted in this bore 17. The bolt 18 constitutes part of a conventional safety element for the slide 12 and which is arranged in the ignition body 6.

Figure 2:
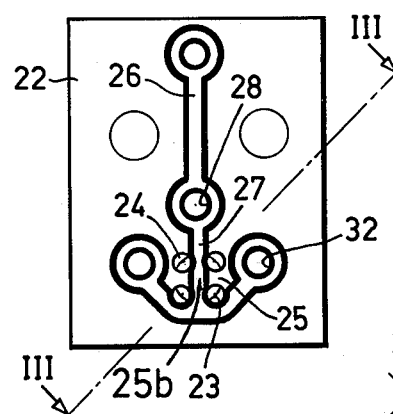
FIG. 2 is a plan view of a printed circuit board having a conductor track of the fuze arrangement of FIG. 1.
Figure 3:
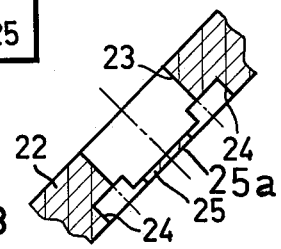
FIG. 3 is a sectional view taken substantially along the line III—III of FIG. 2.

A plate 19 formed of insulating material is attached in the bushing 1 and at the floor or base of the ignition body 6. At the rear surface of the plate 19 there is secured a printed circuit board 22. According to the showing of FIGS. 1, 2 and 3 there is machined or otherwise formed in the printed circuit board 22 a cylindrical blindhole bore 23 which opens towards the front. This bore 23 is opened by four rearwardly extending blindhole bores 24 which intersect the bore 23, so that there is formed a cross-shaped covering or cover 25a constituting a fracture location 25, preferably formed of approximately a 0.3 mm thick layer of the insulating material, for instance hard or laminated paper (laminated phenolic resin or plastic) from which there is formed the printed circuit board 22.

Continuing, it will be seen that at a web or beam 25b of the cross-shaped cover 25a of the blindhole bore 23 of the printed circuit board 22 there is located a conductor portion or part 27 of a conductor track 26, for instance an approximately $50 \times 10^{-3}$ mm thick layer of copper, which for purposes of corrosion protection is gold plated. A pin 29 which is secured in a bore 28 of the printed circuit board 22 is connected with the conductor track 26 and in not particularly illustrated manner with one terminal of a conventional firing or ignition chain 30, for instance an incandescent wire or a gap resistor, of the detonator cap 7, as best seen by referring to FIG. 4.

Figure 4:
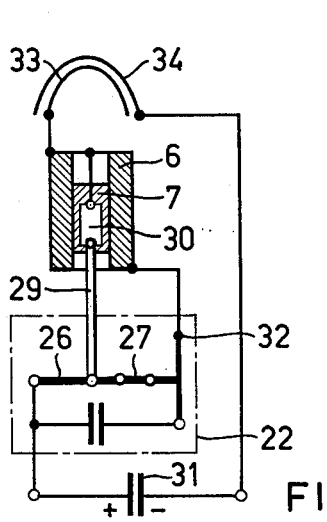
FIG. 4 is an electrical circuit diagram of the fuze.

The conductor track 26, shown in FIG. 4 by thickened lines, is connected with the positive terminal of a capacitor 31 which supplies the firing or ignition energy. A connection location or terminal 32 of the conductor 26 is connected with the firing or ignition body 6 composed of electrically conductive material, at which there is also connected the second terminal of the firing bridge 30 of the detonator cap 7. The conductor portion 27 thus short-circuits the firing or ignition chain 30 and therefore will be conveniently referred to as the short-circuit connection 27.

An impact contact of the fuze which is arranged at the tip of the projectile comprises two hood members 33 and 34 or equivalent structure, composed of electrically conductive material and arranged in mutually spaced relationship. The inner hood member 33 is electrically conductively connected with the firing or ignition body 6 and the outer hood member 34 is connected by means of the projectile body 3 with the negative terminal of the capacitor 31.

Having now had the benefit of the foregoing description of the fuze arrangement of the invention, its mode of operation will be considered and is as follows:

The capacitor 31 is charged in conventional manner upon start of the rocket. During the acceleration phase of the rocket, the safety mechanism arranged in the firing or ignition body 6 releases the bolt 18 which secures the slide 12. This bolt 18 then shifts rearwardly within the bore 17 under the effect of the inertia force and pierces the cover 25a of the printed circuit board 22 together with the short-circuit connection 27, thereby eliminating the short-circuit of the firing or ignition chain 30 of the detonator cap 7. Following the impact of the bolt 18, such remains in the described position until completion of the burning phase of the rocket engine. Due to the deceleration of the rocket, following the burning phase, the resistance of the air causes the bolt 18 to again shift forward in the bore 17.

The slide 12 which has been freed by the bolt 18 is moved into the armed position by means of a not particularly illustrated spring, in which position the primer charge 13 contained in the slide 12 closes the firing chain located along the axis of the projectile and which up to this point in time was interrupted. The slide 12 reaches this position after annihilation of the short-circuit. Upon impact of the rocket at the target the detonation of the explosive charge 15 is initiated by mutual contact of both hood members 33 and 34 i.e. closing of the discharge current circuit of the capacitor 31 by means of the firing chain 30 of the detonator cap 7.

While there are shown and described present preferred embodiments of the invention, it is to be distinctly understood that the invention is not limited thereto, but may be otherwise variously embodied and practiced within the scope of the following claims.

Accordingly, What is claimed is:

1. An electrical fuze for a projectile, especially a rocket, comprising:
    a detonator cap;
    means providing a firing chain for the detonator cap;
    a short-circuit connection for bridging the firing chain;
    a device for interrupting the short-circuit connection;
    said short-circuit connection comprising:
        part of a conductor track arranged at a printed circuit board;
        said part of the conductor track adhering to a layer of the printed circuit board forming a fracture location.

2. The electrical fuze for a projectile as defined in claim 1, wherein:
    said fracture location comprises a substantially cross-shaped cover;
    said conductor track including a beam portion adhering to said cover.

3. An electrical fuze for a projectile, especially a rocket, comprising:
    a detonator cap;
    means providing a firing chain for the detonator cap;
    a short-circuit connection for bridging the firing chain;
    a device for interrupting the short-circuit connection;
    said short-circuit connection comprising:
        part of a conductor track arranged at a printed circuit board;
        said part of the conductor track adhering to a portion of the printed circuit board and providing a fracture location.

4. A short-circuit connection for an electrical fuze for a projectile comprising:
    a printed circuit board including means providing a fracture location;
    a conductor track arranged at the printed circuit board;
    part of the conductor track being arranged at the fracture location of the printed circuit board.

* * * * *